(12) United States Patent
Guo et al.

(10) Patent No.: US 11,906,583 B2
(45) Date of Patent: Feb. 20, 2024

(54) METHOD AND MEASUREMENT INSTRUMENT FOR TESTING A DEVICE UNDER TEST

(71) Applicant: Rohde & Schwarz GmbH & Co. KG, Munich (DE)

(72) Inventors: Kevin Guo, Singapore (SG); Hong Jin Kim, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/545,520

(22) Filed: Dec. 8, 2021

(65) Prior Publication Data

US 2023/0176122 A1 Jun. 8, 2023

(51) Int. Cl.
*G01R 31/3183* (2006.01)
*G01R 31/317* (2006.01)
*G01R 31/3185* (2006.01)

(52) U.S. Cl.
CPC ........ *G01R 31/318314* (2013.01); *G01R 31/31706* (2013.01); *G01R 31/31713* (2013.01); *G01R 31/318536* (2013.01)

(58) Field of Classification Search
None
See application file for complete search history.

(56) References Cited

U.S. PATENT DOCUMENTS

| | | | |
|---|---|---|---|
| 2005/0210179 A1* | 9/2005 | Walmsley | G06F 21/445 711/3 |
| 2012/0326738 A1* | 12/2012 | Kim | G01R 31/318371 324/750.01 |
| 2015/0030062 A1* | 1/2015 | Kossel | H04L 27/01 375/232 |
| 2020/0309832 A1 | 10/2020 | Botelho | |
| 2021/0389349 A1* | 12/2021 | Pickerd | G01R 31/31908 |
| 2021/0390456 A1* | 12/2021 | Pickerd | G01R 31/31708 |
| 2022/0036238 A1* | 2/2022 | R | G06N 20/10 |

FOREIGN PATENT DOCUMENTS

CN 101764651 A * 6/2010
JP 2009-53032 A 3/2009

* cited by examiner

*Primary Examiner* — Guerrier Merant
(74) *Attorney, Agent, or Firm* — Westman, Champlin & Koehler, P.A.

(57) ABSTRACT

The present invention relates to a method for testing a device under test. A component of the device under test generates or receives a bus signal, wherein the bus signal comprises a first data signal or a second data signal, and wherein an amplitude of the first data signal is different from an amplitude of the second data signal. A measurement instrument measures an amplitude of the bus signal. Further, it is determined whether the bus signal comprises the first data signal or the second data signal, based on the measured amplitude of the bus signal.

14 Claims, 3 Drawing Sheets

METHOD AND MEASUREMENT INSTRUMENT FOR TESTING A DEVICE UNDER TEST

TECHNICAL FIELD

The present invention relates to a method for testing a device under test, and to a measurement instrument for testing a device under test. The measurement instrument can be an oscilloscope. In particular, the invention relates to methods and measurement instruments for testing devices under test with a Double Data Rate (DDR) Synchronous Dynamic Random Access Memory (SDRAM).

BACKGROUND

DDR SDRAM relates to a class of memory integrated circuits which is an improvement of single data rate (SDR) SDRAM. Unlike SDR SDRAM, data is no longer transferred only at the rising clock edge, but also at the falling clock edge. For a fixed clock rate, the data throughput is therefore doubled as compared to SDR SDRAM.

Due to the data transfer at both edges of the clock signal, runtime delays are very critical. DDR-SDRAM therefore uses not only the normal system clock for synchronizing data transfer, but an additional bidirectional so-called DQS strobe signal (DQS signal for short). The DQS signal is transmitted in parallel to the data and serves as a reference for a memory controller and the memory in transmitting data. By using the additional DQS signal, a slight drift of the system clock between the memory controller and the memory is no longer a problem.

The basic benefit of DQS is to enable high-speed data transfer for each data pin. This is achieved by reducing access time and propagation delay between memory and memory controller.

During a read command, the DDR SDRAM generates and controls the DQ signal and thus transmits data to the memory controller. During a write operation, the memory controller generates and controls the DQ signal and thus transmits the data to the memory. The read and write operations occur in bursts to increase the throughput of data transfer. Accordingly, read burst signals and write burst signals are sent over the data bus between the memory and the memory controller.

During DDR signal testing or signal decoding, the read burst signal and write burst signal separation is very important because it affects the results greatly. However, separation between read burst signals and write burst signals is also very challenging.

Data for read and write operations is transferred bi-directionally on the same data bus. Read data signals are transmitted from the DDR SDRAM memory, while write data signals originate from the memory controller. For a write burst, the DQ signal and the DQS signal are generally expected to be a quarter cycle out of phase. For a read burst, the DQ signal and the DQS signal are expected to be in phase. In DDR3, preamble pulse shape or phase difference between the DQ signal and the DQS signal may be used to read burst signals from write burst signals. In DDR4, the separation can be based on the phase difference between the DQ signal and the DQS signal.

From US 2020/0309832 A, a method and an apparatus for estimating a phase relation between a first binary signal and a second binary signal is known, in particular to detect phase differences between a clock signal and a data signal.

Further, from JP 2009/053032 A, a waveform display method is known which is capable of selecting and displaying a signal waveform related to one of a read cycle and a write cycle.

In practice, the phase difference between the DQ signal and the DQS signal can be unstable and the actual phase value can therefore be far away from the theoretical value. There are many factors can affect the phase, for example the soldering status, measurement positions and a skew between scope/measurement channels setup. Moreover, some devices under tests have phase tuning issue which can lead to wrong phases. Some device under tests may also have phase drift issue. Any of these factors can severely affect the phase difference.

Therefore, separation of read burst signals from write burst signals based on phase differences between the DQ signal and the DQS signal can lead to wrong results.

SUMMARY

Accordingly, there is a need for reliably separating read burst signals from write burst signals. Generally, there is a need of separating first and second data signals generated by or received from devices under test.

The present invention provides a method for testing a device under test and a measurement instrument for testing a device under test having the features of the independent claims. Further aspects of the invention are recited in the dependent claims.

According to a first aspect, the invention relates to a method for testing a device under test. A component of the device under test generates or receives a bus signal, wherein the bus signal comprises a first data signal or a second data signal, and wherein an amplitude of the first data signal is different from an amplitude of the second data signal. A measurement instrument measures an amplitude of the bus signal. Further, it is determined whether the bus signal comprises the first data signal or the second data signal, based on the measured amplitude of the bus signal.

According to a second aspect, the invention relates to a measurement instrument, in particular an oscilloscope, for testing a device under test, wherein a component of the device under test generates or receives a bus signal, wherein the bus signal comprises a first data signal or a second data signal, and wherein an amplitude of the first data signal is different from an amplitude of the second data signal. The measurement instrument comprises a measurement unit, configured to measure an amplitude of the bus signal. The measurement instrument further comprises a determining unit, configured to determine whether the bus signal comprises the first data signal or the second data signal, based on the measured amplitude of the bus signal.

The invention provides a simple and efficient way to easily separate first data signals from the second data signals based on differences of the corresponding amplitudes.

An underlying idea of the invention is the observation that two signals generated by devices under test and/or received by devices under test may be separated based on the different amplitude behavior.

According to a further embodiment of the method for testing the device under test, the first signal comprises a read command According to a further embodiment, the second signal comprises a write command It has been observed that read burst signals (or read commands) and write burst signals (or write commands) have different amplitude behaviors.

In some cases, the amplitude of the read burst signal may be higher than the amplitude of the write burst signal. For other devices the amplitude of the write burst signal may be higher than the amplitude of the read burst signal. However, for specific devices under test, the amplitude relationship between read burst signals and write burst signals is consistent, i.e., the relationship is fixed and does not change. Accordingly, it is possible to identify the read burst signals and write burst signals based on the amplitude of the bus signal.

According to a further embodiment of the method for testing the device under test, the bus signal comprises a double data rate, DDR, signal. The bus signal may comprise any of DDR, DDR2, DDR3, DDR4 or DDR5 signals. According to this embodiment, the device under test comprises a memory controller and a memory. A write command or a read command may be transmitted between the memory controller and the memory.

According to a further embodiment of the method for testing the device under test, measuring the amplitude of the bus signal comprises measuring a peak-to-peak amplitude of the bus signal. The peak-to-peak amplitude can be used to determine whether the amplitude of the bus signal relates to the data signal of the first data signal and the second data signal with the larger amplitude or the data signal of the first data signal and the second data signal with the smaller amplitude. The peak-to-peak amplitude can easily be determined and, therefore, the determination of whether the bus signal comprises the first data signal or the second data signal can easily be achieved.

According to a further embodiment of the method for testing the device under test, the measured amplitude of the bus signal is compared with a threshold value. If the measured amplitude is larger than the threshold value, it is determined that the bus signal comprises a data signal of the first data signal and the second data signal having the larger amplitude. If the measured amplitude is smaller than the threshold value, it is determined that the bus signal comprises a data signal of the first data signal and the second data signal having the smaller amplitude. According to an embodiment, the peak-to-peak amplitude is measured and compared to the threshold value.

According to a further embodiment of the method for testing the device under test, there can be two threshold values, wherein a first threshold value is smaller than a second threshold value. If the amplitude is smaller than the first threshold value, it is determined that the bus signal comprises a data signal of the first data signal and the second data signal having the smaller amplitude. If the measured amplitude is larger than the second threshold value, it is determined that the bus signal comprises a data signal of the first data signal and the second data signal having the larger amplitude. If the measured amplitude is equal to or larger than the first threshold value and equal to or smaller than the second threshold value, it can be determined that it cannot conclusively be decided whether the bus signal comprises the first data signal or the second data signal. According to this embodiment, unclear cases can be identified. Preferably, measurement may be repeated.

According to a further embodiment of the method for testing the device under test, user input from a user is received via a user interface. Based on the user input, a data signal of the first data signal and the second data signal having a larger amplitude is identified. The step of determining whether the bus signal comprises the first data signal or the second data signal is further based on the identification of the data signal of the first data signal and the second data signal having a larger amplitude. For example, the user may have knowledge during a calibration test whether the bus signal comprises the first data signal or the second data signal. The user then measures the corresponding amplitude of the bus signal during the calibration test. Based on the amplitude, the user may identify the specific amplitude relation of the first data signal and the second data signal for the device under test. The method can then be calibrated to provide information regarding the amplitude relation of the first data signal and the second data signal. Because the amplitude relation (i.e., which of the first data signal and the second data signal has the larger/smaller amplitude) does not change over time, the amplitude relation determined during the calibration test can be used for further measurements.

According to a further embodiment of the method for testing the device under test, a data signal of the first data signal and the second data signal having a larger amplitude is identified based on a type of the device under test. E.g., it may be known that for all devices under test of a given type, the first data signal has a larger amplitude than the second data signal. A user may provide information identifying the type of the device under test.

According to a further embodiment of the method for testing the device under test, the user interface comprises means for selecting the amplitude relation. For example, the user is given the two options "the amplitude of the first data signal is larger than the amplitude of the second data signal" and "the amplitude of the second data signal is larger than the amplitude of the first data signal". The user can select one of the two options. The means for selecting the amplitude relation may comprise a touch display, a switch, a button or the like.

According to a further embodiment of the method for testing the device under test, information whether the bus signal comprises the first data signal or the second data signal is output to a user via a user interface. The user interface may comprise a display for displaying the information.

According to a further embodiment of the method for testing the device under test, the device under test is connected to a bus for signaling and the "bus signal" is a signal transmitted over the bus.

According to a further embodiment of the measurement instrument, the measurement unit is configured to measure a peak-to-peak amplitude of the bus signal.

According to a further embodiment of the measurement instrument, the determining unit is further configured to compare the measured amplitude of the bus signal with a threshold value. The determining unit is further configured to determine, if the measured amplitude is larger than the threshold value, that the bus signal comprises a data signal of the first data signal and the second data signal having the larger amplitude.

According to a further embodiment of the measurement instrument, the determining unit is further configured to determine, if the measured amplitude is smaller than the threshold value, that the bus signal comprises a data signal of the first data signal and the second data signal having the smaller amplitude.

According to a further embodiment, the measurement instrument further comprises a user interface configured to receive user input from a user. The determining unit is further configured to identify, based on the user input, a data signal of the first data signal and the second data signal having a larger amplitude. The determination unit is further configured to determine whether the bus signal comprises the first data signal or the second data signal, further based on the identification of the data signal of the first data signal and the second data signal having a larger amplitude.

According to a further embodiment, the measurement instrument further comprises a user interface configured to output information to a user whether the bus signal comprises the first data signal or the second data signal.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
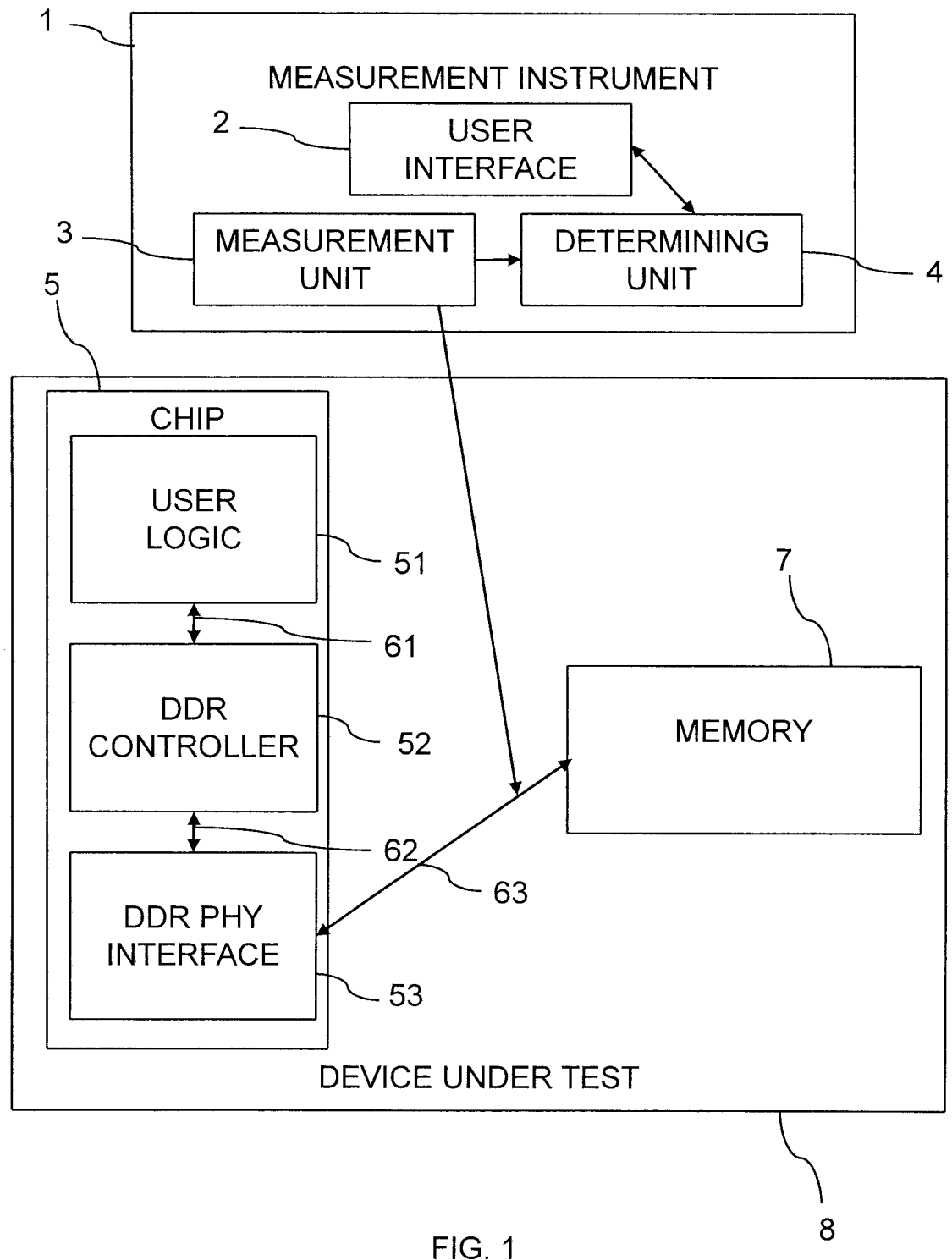
FIG. 1 shows a schematic block diagram of a measurement instrument for testing a device under test according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

DETAILED DESCRIPTION OF THE DRAWINGS

FIG. 1 shows a schematic block diagram of a measurement instrument 1 for testing a device under test 8. The measurement instrument 1 may be an oscilloscope, a spectrum analyzer, a vector signal analyzer, a network analyzer or the like.

The device under test 8 may be a printed circuit board comprising a plurality of electronic components, e.g. discrete components such as coils or capacitors as well as integrated components such as microprocessors or ASICs. The device under test comprises a chip 5 and a memory 7. The memory 7 can be a DDR SDRAM memory, in particular a DDR, DDR2, DDR3, DDR4 or DDR5 memory.

The chip 5 can be an application-specific integrated circuit, ASIC, or a field programmable gate array, FPGA. The chip 5 comprises a user logic 51, a DDR controller 52 and a physical layer DDR PHY interface 53. Further, there is provided a first bus 61 between the logic 51 and the DDR controller 52, a second bus 62 between the DDR controller 52 and the DDR PHY interface 53 and a third bus 63 between the DDR PHY interface 53 and the memory 7. Each of the buses 61 to 63 may be implemented by one or more signal lines between the respective components.

Several bus signals are transmitted on the buses 61 to 63, wherein the signals may comprise a clock signal CLK, an address signal ADDR, a data signal DQ, a read strobe signal DQS, and a command signal CMD.

The user logic 51 can make read or write requests to the DDR controller 52 and can provide a logical address. The controller 52 converts the logical address into a physical address and asserts a command to the DDR PHY interface. The DDR PHY interface 53 sends bus signals to the memory 7 and receives bus signals from the memory 7 over the third bus 63. The memory 7 (i.e., a component of the device under test 8) can therefore generate or receive a bus signal over the third bus 63.

The bus signal may comprise a read signal (i.e. a first data signal, for example a read burst signal) and a write signal (i.e. a second data signal, for example a write burst signal).

The read command can be a first data signal and the write command can be a second data signal. An amplitude of the first data signal is different from an amplitude of the second data signal, i.e., the first data signal and the second data signal have a nontrivial amplitude relation (maximal amplitudes of different magnitudes). For example, the amplitude of the first data signal (e.g., a read command) can be larger than the amplitude of the second data signal (e.g., a write command) For other devices under test 5, the amplitude of the second data signal (e.g., a write command) is larger than the amplitude of the first data signal (e.g., a read command)

Herein, an amplitude of one of the data signal can be "larger" than an amplitude of the other of the data signals, if a respective maximum value of the amplitude of the data signal is larger than the maximum value of the other data signal, or if a peak-to-peak-amplitude of the data signal is larger than the peak-to-peak-amplitude of the other data signal.

The measurement instrument 7 comprises a measurement unit 3 which can comprise electronic circuits for measuring signal amplitudes. The measurement unit 3 is coupled to the third bus 63 for measuring an amplitude of the signals. The measurement unit 3 may record the amplitude of the respective signals as a function of time. The measurement unit 3 may sample a signal on at least one of the lines of the bus 63 and may store discrete values. The measurement unit 3 can comprise a storage for storing the measured values (e.g., amplitude values). The storage may be a volatile or non-volatile data memory, e.g., a solid-state disk, memory card or the like.

The measurement unit 3 may further comprise components for signal processing, for instance for performing Fourier analysis on measurement results.

The measurement unit 3 provides the measurement results or the processed measurement results to a determining unit 4. The determining unit 4 can comprise at least one of a central processing unit (CPU), a graphics processing unit (GPU), a microcontroller (μC), an integrated circuit (IC), an application-specific integrated circuit (ASIC), an application-specific standard product (ASSP), a digital signal processor (DSP), and a field programmable gate array (FPGA). The measurement unit 3 may comprise a plurality of single units, like hardware interfaces, communication controllers, processors and the like.

The determining unit 4 receives the measured amplitude of the bus signal and determines, based on the measured amplitude, whether the bus signal comprises the first data signal or the second data signal.

The measurement instrument 1 further comprises a user interface 2 which can comprise input devices and output devices. The input devices may comprise a microphone, a touch screen, switches, buttons, a keyboard, a pointing device, e.g., a mouse or a trackball, by which the user can provide input to the user interface 2. The output devices may comprise loudspeakers or a display (e.g., the touch screen).

The user interface 4 may receive information from a user, identifying which of the first data signal and the second data signal has a larger amplitude. The user may identify which of the first data signal and the second data signal has a larger amplitude in a configuration test, where known signals are asserted (e.g., first a read signal, then write signal). The user then measures the amplitude using the measurement instrument 3 and identifies the amplitude relation of the first data signal and the second data signal and provides information about the identified amplitude relation to the user interface 2.

For later measurements of the measurement unit 3, the determining unit 4 can determine whether the bus signal comprises the first data signal or the second data signal, based on the identification of the data signal of the first data signal and the second data signal having a larger amplitude, and based on the measured amplitude of the bus signal.

For example, if the amplitude (e.g., peak-to-peak amplitude) is larger than a threshold, the determining unit 4 determines that the bus signal comprises the data signal of the first data signal and the second data signal having the larger amplitude, which is known to the determining unit 4 from the user input. In turn, if the amplitude (e.g., peak-to-peak amplitude) is smaller than the threshold, determining unit 4 determines that the bus signal comprises the data signal of the first data signal and the second data signal having the smaller amplitude.

The determining unit 4 may further output information to the user whether the bus signal comprises the first data signal or the second data signal over the user interface 2, e.g., by displaying the information on a display of the user interface 2.

Figure 2:
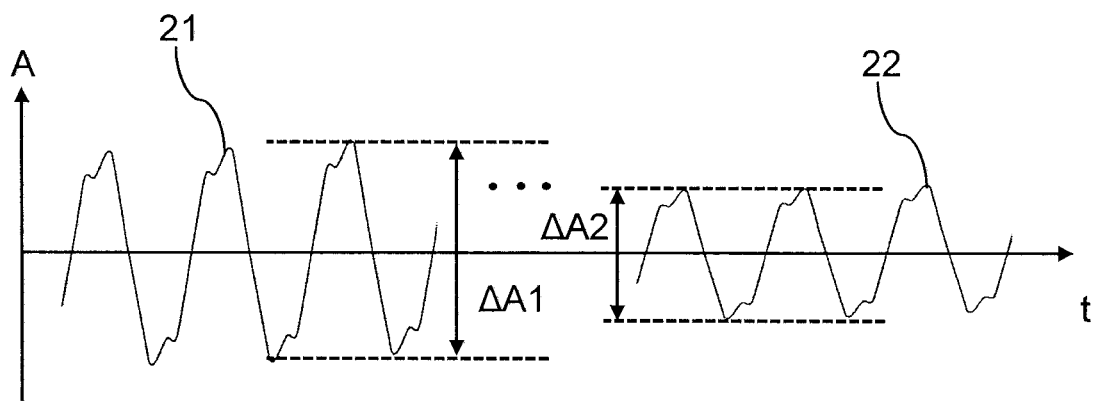
FIG. 2 shows a schematic signal, illustrating the amplitude relation for the first data signal and the second data signal according to an example.

FIG. 2 shows a schematic signal, illustrating the amplitude relation for the first data signal and the second data signal according to an example. The amplitude A changes as a function of time t. During a first phase, the first data signal 21 (e.g., a read signal) is sent over the third bus 63, having a first peak-to-peak amplitude $\Delta A1$. During a second phase, the second data signal 22 (e.g., a write signal) is sent over the third bus 63, having a second peak-to-peak amplitude $\Delta A2$. In the example illustrated in FIG. 2, the first peak-to-peak amplitude $\Delta A1$ is larger than the second peak-to-peak amplitude $\Delta A2$. However, for different devices under test 8, the first peak-to-peak amplitude $\Delta A1$ can be smaller than the second peak-to-peak amplitude $\Delta A2$.

However, the amplitude relation $\Delta A1/\Delta A2$ is either smaller than 1 or larger than 1 but does not get inverted. Therefore, the amplitude relation $\Delta A1/\Delta A2$ can be used to identify the type of signal (i.e., whether the bus signal is the first data signal or the second data signal).

Figure 3:
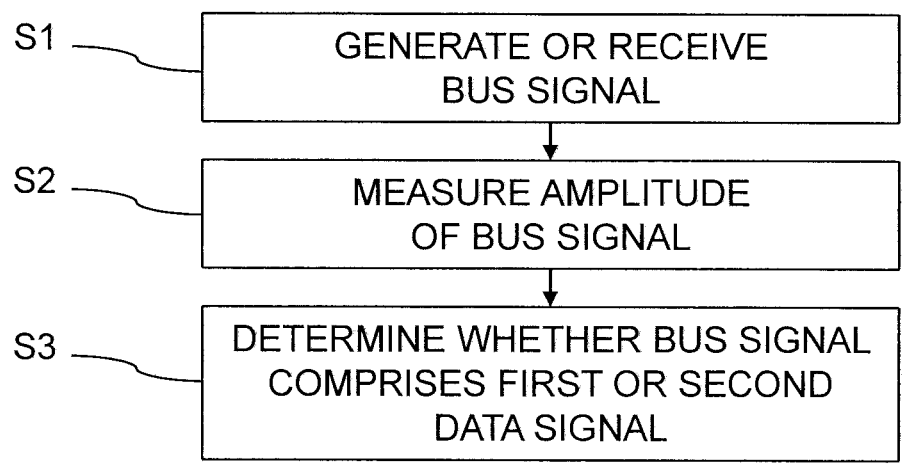
FIG. 3 shows a flowchart of a method for testing a device under test according to an embodiment of the invention.

FIG. 3 shows a flowchart of a method for testing a device under test. The method may be carried out using a measurement instrument 1 as illustrated in FIG. 1 and described above.

In step S1, a component of the device under test 8 generates or receives a bus signal. The component of the device under test 8 can be a DDR memory 7, e.g., a DDR, DDR2, DDR3, DDR4 or DDR5 memory.

The bus signal can be a signal generated externally to the device under test 8 but can also be a signal generated internally. For example, the device under test 8 may further comprise a chip 5, comprising user logic 51, a DDR controller 52 and a DDR PHY interface 53. The bus signal can be generated by components of the chip 5.

The bus signal generated and received by the DDR memory 7 comprises exactly one of a first data signal and a second data signal. The first data signal can be a read signal and the second data signal can be a write signal. The first data signal and the second data signal have a fixed amplitude relationship (e.g., of peak-to-peak amplitudes $\Delta A1/\Delta A2$), i.e., a maximal (or peak-to-peak) amplitude of one of the data signals is always larger than a maximal (or peak-to-peak) amplitude of the other of the data signals.

In step S2, a measurement unit 3 of a measurement instrument 1 measures an amplitude of the bus signal.

In step S3, a determining unit 4 determines whether the bus signal comprises the first data signal or the second data signal, based on the measured amplitude of the bus signal. The determining unit 4 may compare the measured amplitude of the bus signal with a threshold value. If the measured amplitude is larger than the threshold value, the determining unit 4 determines that the bus signal comprises a data signal of the first data signal and the second data signal having the larger amplitude. If the measured amplitude is smaller than the threshold value, the determining unit 4 determines that the bus signal comprises a data signal of the first data signal and the second data signal having the smaller amplitude.

The amplitude relationship (i.e., which of the data signal of the first data signal and the second data signal has the larger amplitude and which of the data signal of the first data signal and the second data signal has the smaller amplitude) can be provided to the determining unit 4 based on user input received from a user via a user interface 2.

The result of the determination whether the bus signal comprises the first data signal or the second data signal can be provided to the user over the user interface 2.

Summarizing, the invention relates to the separation of a first data signal and a second data signal, based on an amplitude relationship of the first data signal and the second data signal.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A method for testing a device under test, the method comprising:
   generating or receiving, by a component of the device under test, a bus signal, wherein the bus signal comprises a first data signal or a second data signal, and wherein an amplitude of the first data signal is different from an amplitude of the second data signal;
   measuring, by a measurement instrument, an amplitude of the bus signal;
   comparing the measured amplitude of the bus signal with a threshold value; and
   determining whether the bus signal comprises the first data signal or the second data signal, based on the measured amplitude of the bus signal, wherein, if the measured amplitude is larger than the threshold value, it is determined that the bus signal comprises a data signal of the first data signal and the second data signal having a larger amplitude.

2. The method of claim 1, wherein the first signal comprises a read command.

3. The method of claim 1, wherein the second signal comprises a write command.

4. The method of claim 1, wherein the bus signal comprises a double data rate, DDR, signal.

5. The method of claim 4, wherein the bus signal comprises a double data rate 4, DDR4, signal.

6. The method of claim 1, wherein measuring the amplitude of the bus signal comprises measuring a peak-to-peak amplitude of the bus signal.

7. The method of claim 1, further comprising determining, if the measured amplitude is smaller than the threshold value, that the bus signal comprises a data signal of the first data signal and the second data signal having a smaller amplitude.

8. The method of claim 1, further comprising:
   receiving user input from a user via a user interface; and
   identifying, based on the user input, a data signal of the first data signal and the second data signal having a larger amplitude;
   wherein the step of determining whether the bus signal comprises the first data signal or the second data signal is further based on the identification of the data signal of the first data signal and the second data signal having a larger amplitude.

9. The method of claim 1, further comprising outputting information whether the bus signal comprises the first data signal or the second data signal to a user via a user interface.

10. A measurement instrument, in particular an oscilloscope, for testing a device under test, wherein a component of the device under test generates or receives a bus signal, wherein the bus signal comprises a first data signal or a second data signal, wherein an amplitude of the first data signal is different from an amplitude of the second data signal, the measurement instrument comprising:
    a measurement unit, configured to measure an amplitude of the bus signal; and
    a determining unit, configured to compare the measured amplitude of the bus signal with a threshold value and to determine whether the bus signal comprises the first data signal or the second data signal, based on the measured amplitude of the bus signal;
    wherein the determining unit is configured to determine, if the measured amplitude is larger than the threshold value, that the bus signal comprises a data signal of the first data signal and the second data signal having a larger amplitude.

11. The measurement instrument of claim 10, wherein the measurement unit is configured to measure a peak-to-peak amplitude of the bus signal.

12. The measurement instrument of claim 10, wherein the determining unit is further configured to determine, if the measured amplitude is smaller than the threshold value, that the bus signal comprises a data signal of the first data signal and the second data signal having a smaller amplitude.

13. The measurement instrument of claim 10, further comprising:
    a user interface configured to receive user input from a user;
    wherein the determining unit is further configured to identify, based on the user input, a data signal of the first data signal and the second data signal having a larger amplitude; and
    wherein the determination unit is further configured to determine whether the bus signal comprises the first data signal or the second data signal, further based on the identification of the data signal of the first data signal and the second data signal having a larger amplitude.

14. The measurement instrument of claim 10, further comprising a user interface configured to output information to a user whether the bus signal comprises the first data signal or the second data signal.

* * * * *